United States Patent
Saito et al.

(10) Patent No.: US 7,234,358 B2
(45) Date of Patent: Jun. 26, 2007

(54) PRESSURE DETECTING APPARATUS

(75) Inventors: Kazunori Saito, Matsumoto (JP); Yuji Ichimura, Matsumoto (JP); Kei Yamaguchi, Matsumoto (JP); Katsumichi Ueyanagi, Matsumoto (JP); Shigeru Shinoda, Matsumoto (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 0 days.

(21) Appl. No.: 11/354,959

(22) Filed: Feb. 16, 2006

(65) Prior Publication Data

US 2006/0243054 A1    Nov. 2, 2006

(30) Foreign Application Priority Data

Apr. 27, 2005    (JP)    ............... 2005-130533

(51) Int. Cl.
*G01L 9/00*    (2006.01)
(52) U.S. Cl. .......................... 73/754; 73/753
(58) Field of Classification Search .......... 73/700–756; 361/283.1–283.4
See application file for complete search history.

(56) References Cited

U.S. PATENT DOCUMENTS 4,437,138 A * 3/1984 Nicol ...................... 361/283.2

FOREIGN PATENT DOCUMENTS

| JP | 2003-247903 | 9/2003 |
| JP | 2004-045184 | 2/2004 |
| WO | WO 9400755 A1 * | 1/1994 |

* cited by examiner

*Primary Examiner*—Edward Lefkowitz
*Assistant Examiner*—Jermaine Jenkins
(74) *Attorney, Agent, or Firm*—Manabu Kanesaka (57) ABSTRACT

A pressure detecting apparatus has a pressure detecting device that converts a strain caused by a stress exerted thereto to an electrical signal, and outputs the converted electrical signal. The apparatus has a housing base including a housing recess that houses the pressure detecting device therein, and a connecting material interposed between the pressure detecting device and the housing recess. The connecting material connects the pressure detecting device and the housing recess with a tensile elongation percentage of about 400% or higher. The pressure detecting apparatus facilitates preventing thermal stress from adversely affecting the detection performance thereof, and produces excellent thermal response.

8 Claims, 4 Drawing Sheets

PRESSURE DETECTING APPARATUS

BACKGROUND OF THE INVENTION AND RELATED ART STATEMENT

The present invention relates to a pressure detecting apparatus that converts the pressure detected thereby to an electrical signal and outputs the converted electrical signal. Specifically, the present invention relates also to a pressure detecting apparatus that exhibits excellent thermal response.

Usually, the semiconductor pressure sensor chip that employs the so-called piezoresistance effects has been used for a pressure detecting apparatus for measuring the intake air pressure on the air intake side of an engine in the electronic controlled fuel injection apparatus for automobiles. Since the operational principles of the pressure detecting apparatus that employs the semiconductor pressure sensor chip as described above are well known, the detailed descriptions thereof are omitted. The pressure detecting apparatus includes a bridge circuit consisting of semiconductor strain gauges formed on a diaphragm made of a material that exhibits piezoresistance effects such as single crystalline silicon. A pressure is detected by taking out the gauge resistance changes, caused in the semiconductor strain gauges by the diaphragm distortion, from the bridge circuit in the form of an electrical signal.

Figure 5:
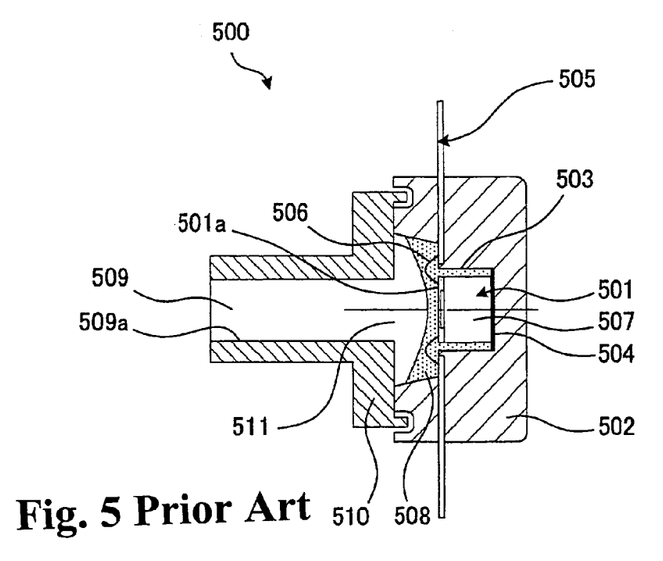
FIG. 5 is a cross-sectional view of a conventional pressure detecting apparatus.
Figure 6:
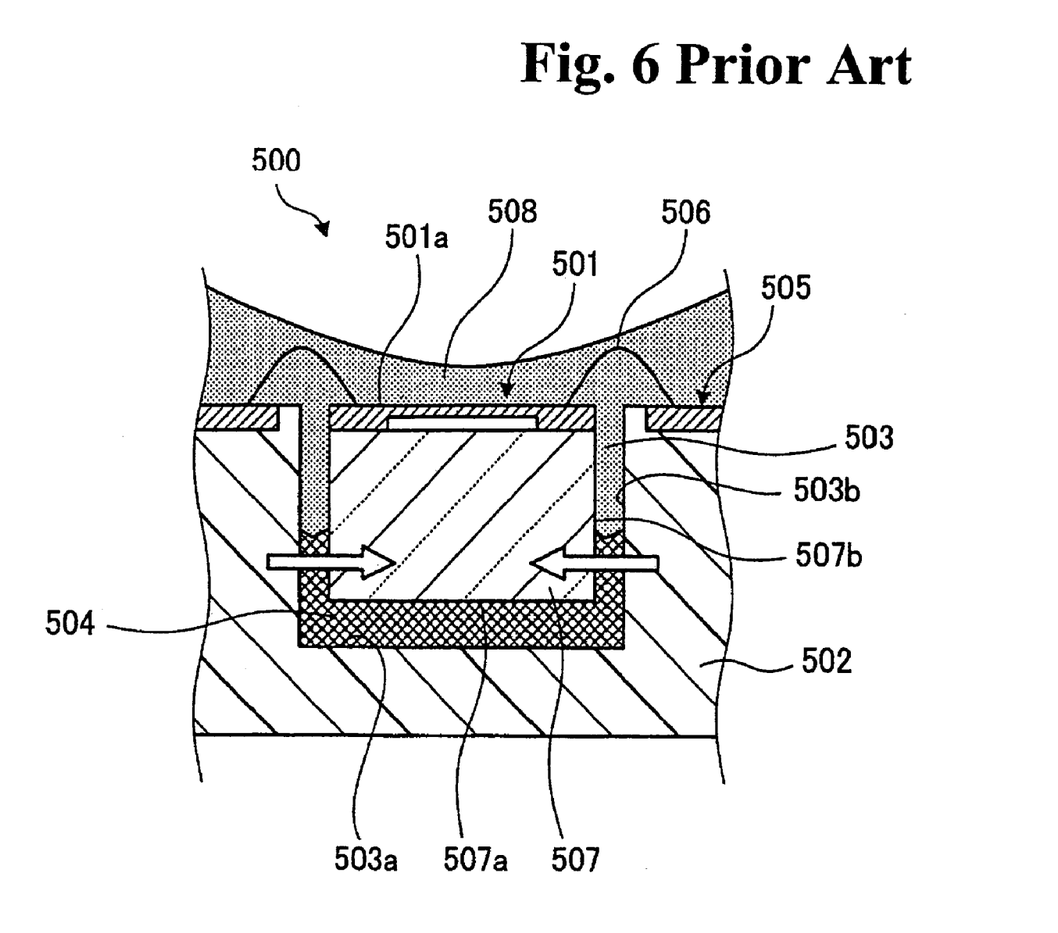
FIG. 6 is an expanded cross-sectional view showing a part of the conventional pressure detecting apparatus shown in FIG. 5.

Now the pressure detecting apparatus briefly described above will be explained below with reference to FIGS. 5 and 6. FIG. 5 is a cross-sectional view of a conventional pressure detecting apparatus. FIG. 6 is an expanded cross-sectional view showing a part of the conventional pressure detecting apparatus shown in FIG. 5. Referring now to these drawings, a pressure detecting apparatus 500 includes a pressure detecting device 501, that is a semiconductor pressure sensor chip, mounted on a housing base 502 of a resin molding, that is a package casing of pressure detecting apparatus 500. A housing recess 503 for housing pressure detecting device 501 therein is formed in housing base 502.

Pressure detecting device 501 is mounted on housing base 502 in such a configuration, in which pressure detecting device 501 is bonded by die-bonding with an adhesive 504 to housing recess 503 formed in housing base 502. Pressure detecting device 501 is electrically connected, via bonding wires 506, to lead terminals (lead frames) 505 integrated into housing base 502 by insertion molding such that lead terminals 505 are extending through housing base 502.

For reducing the stress exerted from housing base 502 in the structure described above, pressure detecting device 501 is bonded to a pedestal 507 made of glass by the anodic bonding technique known to those skilled in the art such that a vacuum reference space is formed between pressure detecting device 501 and glass pedestal 507. A gel protecting material 508 covers the surface 501a of pressure detecting device 501 and adheres pressure detecting device 501 to housing base 502 in such a manner that gel protecting material 508 contains bonding wires 506 therein. Protecting material 508 protects pressure detecting device 501 from the contaminants contained in the not-shown medium, the pressure thereof is to be measured with pressure detecting apparatus 500, and transmits the medium pressure to pressure detecting device 501. Protecting material 508 is also disposed between the side face of detecting device 501 and the side face of housing recess 503.

A housing cover 510 formed of a molded resin material includes a tube-shaped pressure transmitting section 509 having a cylindrical inner surface 509a (cf. FIG. 5). Housing cover 510 is mounted on and fixed, with an adhesive, to the opening side end portion of housing recess 503 in housing base 502 such that a pressure detecting space 511 consisting of a space connected to pressure transmitting section 509 is formed (cf. FIG. 5). The medium pressure to be measured is transmitted to pressure detecting space 511 through pressure transmitting section 509 in housing cover 510. Pressure detecting apparatus 500 detects the pressure difference between the transmitted medium pressure to be measured and the vacuum reference room pressure as a pressure change, converts the detected pressure change to an electrical signal in pressure detecting device 501, and outputs the converted electrical signal. Thus, the absolute medium pressure is measured.

For meeting the various demands for pressure detecting apparatus 500 such as down-sizing of entire pressure detecting apparatus 500, realization of very precise detection characteristics and realization of very high reliability, the opening size of housing recess 503 is optimized so that a clearance optimum for reducing the stress exerted from housing base 502 may be obtained between pressure detecting device 501 and housing base 502 (cf. Japanese Patent Publication No. 2003-247903).

In pressure detecting apparatus 500 having the structure as described above, the deformation of housing base 502 caused by an external stress exerted from housing cover 510 or by a thermal stress due to a severe measurement environment associating drastic temperature changes adversely affects the detection performances of pressure detecting device 501, impairing the thermal response of pressure detecting apparatus 500.

The thermal response is one of the evaluation items for performances tests indicating the detection performances change caused by the environmental temperature change, e.g. from a high temperature to a low temperature. In the pressure detecting apparatus, the thermal response thereof is not good, variations are caused between the initial detection performances and the detection performances after a temperature change is caused.

If the loading amount of adhesive 504 for mounting pressure detecting device 501 on housing base 502 is too large, adhesive 504, which has bulged out of the gap between the bottom surface 503a of housing recess 503 and the bottom surface 507a of pedestal 507 creeps up the clearance between pressure detecting device 501 and housing base 502, that is, the gap between the side face 507b of pedestal 507 and the side face 503b of housing recess 503 as shown in FIG. 6. Therefore, the stress caused, for example, by the deformation of housing base 502 in the direction indicated by the outline arrows in FIG. 6 directly affects the detection performances of pressure detecting device 501, impairing the thermal response of pressure detecting apparatus 500.

In view of the foregoing, it would be desirable to provide a pressure detecting apparatus that facilitates reducing the adverse effects of thermal stress on the detection performances to the extreme thereof and exhibits excellent thermal response.

Further objects and advantages of the invention will be apparent from the following description of the invention and the associated drawings.

SUMMARY OF THE INVENTION

According to one embodiment of the invention, there is provided a pressure detecting apparatus including a pressure detecting means, the pressure detecting means converting the strain caused by the stress exerted thereto to an electrical signal, the pressure detecting means outputting the converted electrical signal; a base means including a housing means, the housing means housing the pressure detecting means therein; and a connecting means interposed between the pressure detecting means and the housing means, the connecting means connecting the pressure detecting means and the housing means at a tensile elongation percentage of 400% or higher.

According to one aspect of the invention, the pressure detecting means is made of a semiconductor.

According to another aspect of the invention, the base means is formed of a resin molding.

According to another aspect of the invention, the connecting means is made of a silicone resin adhesive.

According to another aspect of the invention, the connecting means is formed such that the distance between the bonding plane of the pressure detecting means and the bonding plane of the housing means is from 30 μm to 100 μm.

Since the pressure detecting means and the base means are connected and fixed to each other with the connecting means exhibiting an elongation percentage of about 400% or higher, the pressure detecting apparatus according to the invention that facilitates absorbing the exerted stress based on the excellent elongation characteristics exhibits excellent thermal response.

The pressure detecting apparatus according to the invention that exhibits excellent thermal response facilitates realizing a structure immune to temperature changes caused in the measurement environment and obtaining measurement results with very high reproducibility.

DETAILED DESCRIPTION OF THE PREFERRED EMBODIMENTS

Now the invention will be described in detail hereinafter with reference to the accompanied drawings which illustrate the preferred embodiments of the invention. In the descriptions of the embodiments and the drawings illustrating the embodiments, the same reference numbers are used to designate the same of like constituent elements and their duplicated explanations are omitted for the sake of simplicity.

Figure 1:
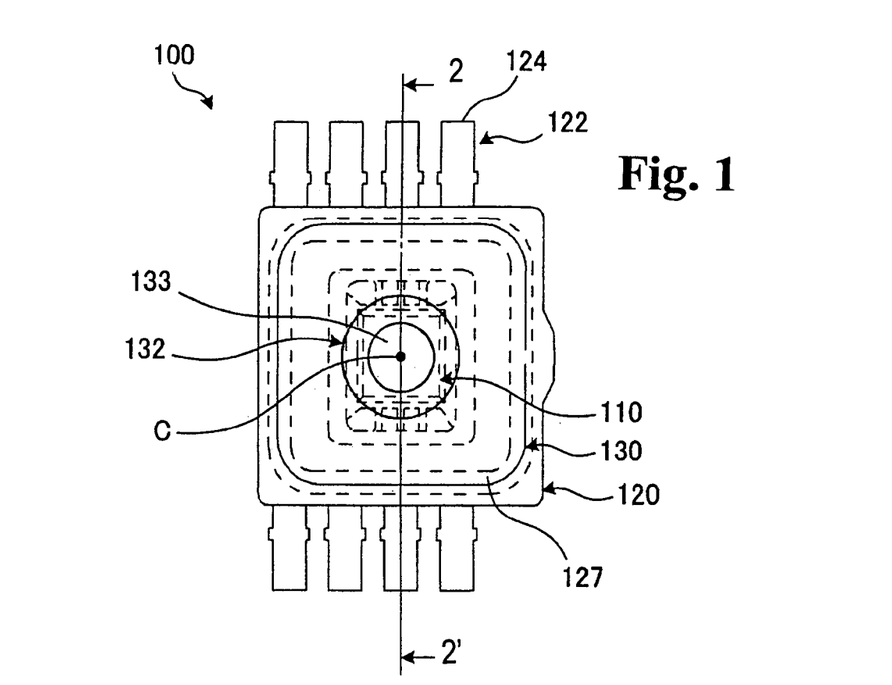
FIG. 1 is a top plan view of a pressure detecting apparatus according to a first embodiment of the invention.
Figure 2:
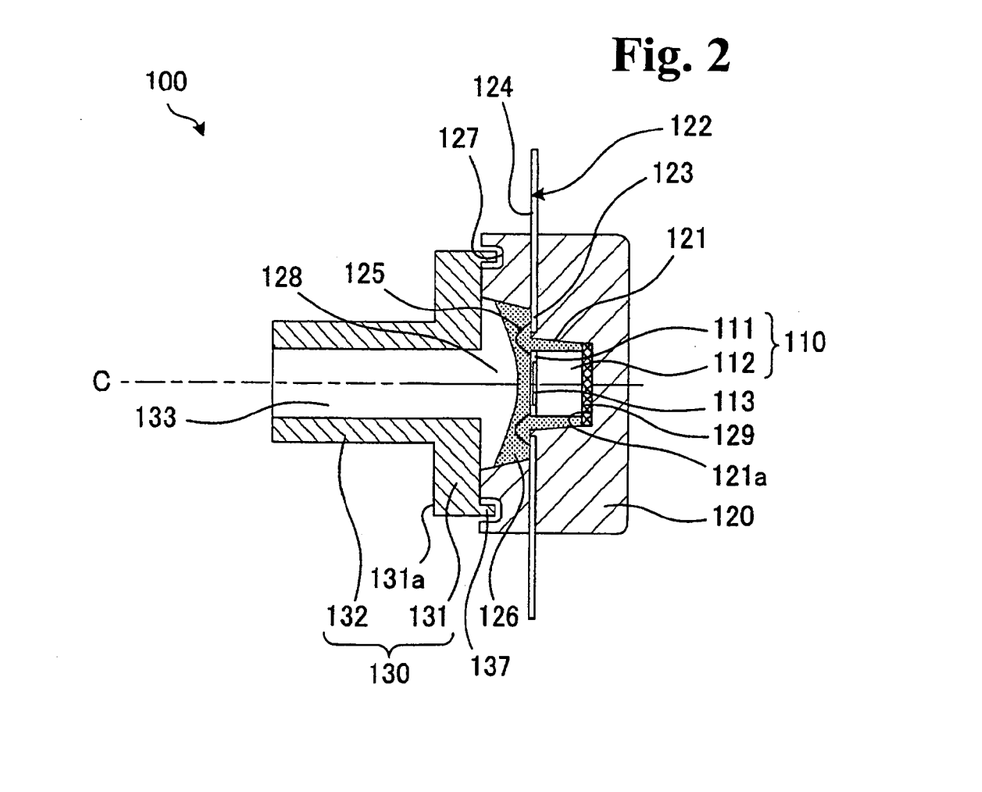
FIG. 2 is a cross-sectional view along the line segment 2–2' in FIG. 1.
Figure 3A:
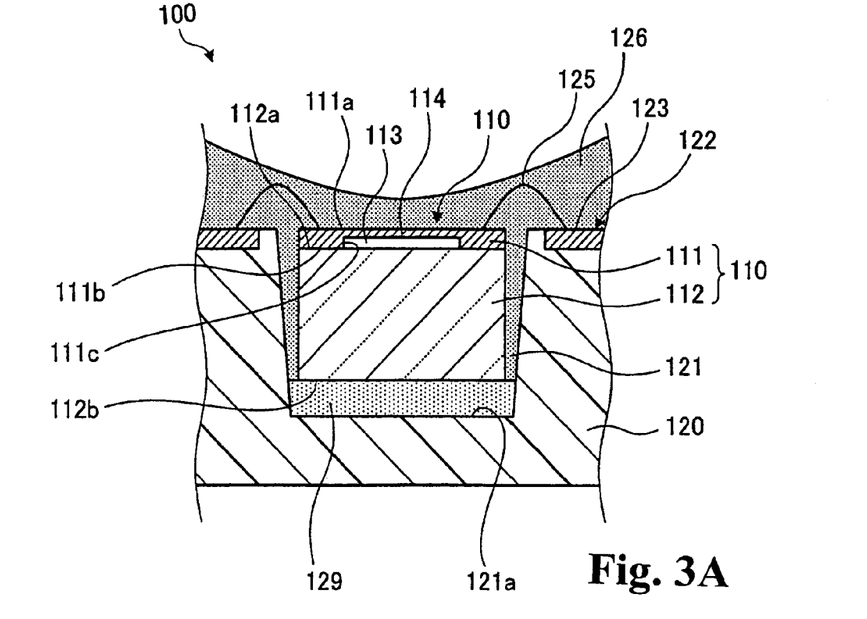
FIG. 3A is an expanded cross-sectional view of a part of FIG. 2.
Figure 3B:
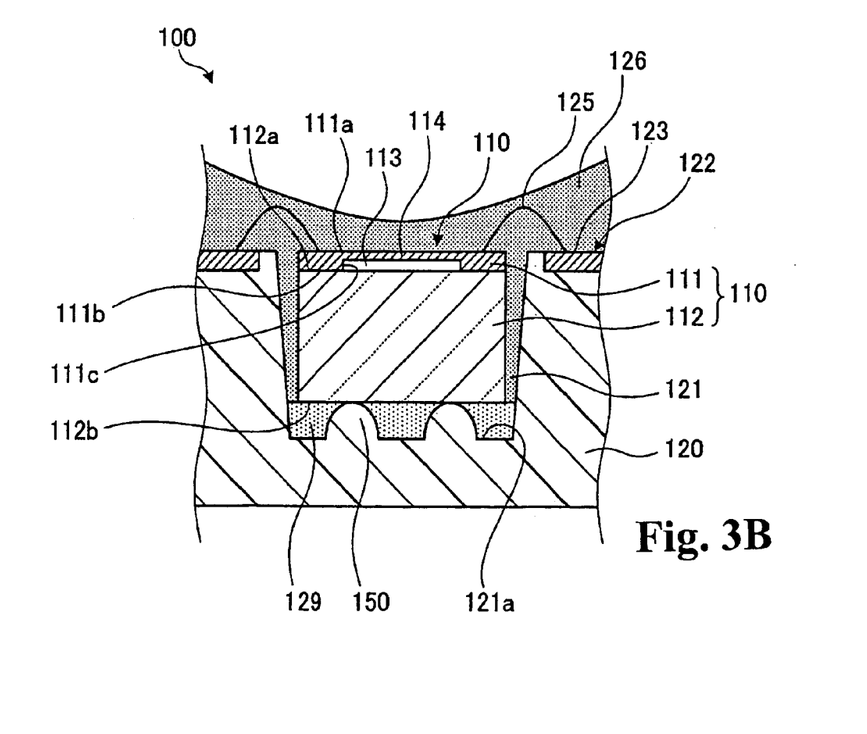
FIG. 3B is a cross-sectional view showing a modification of the structure shown in FIG. 3A.

FIG. 1 is a top plan view of a pressure detecting apparatus according to a first embodiment of the invention. FIG. 2 is a cross-sectional view along the line segment 2–2' in FIG. 1. FIG. 3A is an expanded cross-sectional view of a part of FIG. 2. FIG. 3B is a cross-sectional view showing a modification of the structure shown in FIG. 3A. In the following, the invention will be described with reference to FIGS. 1 through 3B as far as any specific explanation is not made and the reference numbers designating the constituent elements not illustrated in the drawings will not be described in the drawings.

Referring now to FIGS. 1 through 3A, the pressure detecting apparatus 100 according to the first embodiment includes a pressure detecting device 110, a housing base 120 housing pressure detecting device 110 therein, and a housing cover 130 mounted on housing base 120. Pressure detecting device 110, housing base 120 and housing cover 130 are arranged in a coaxial manner with the centers thereof aligned on a central axis C.

Pressure detecting device 110 includes a semiconductor substrate 111 made of silicon and a pedestal 112 made of glass and bonded to semiconductor substrate 111. Semiconductor substrate 111 is bonded to pedestal 112 by the anodic bonding technique known to those skilled in the art to reduce the stress exerted from housing base 120. Semiconductor substrate 111 has a recess 111c in the bottom surface 111b on the side of the bonding surface 112a of pedestal 112. Pressure detecting device 110 uses recess 111c of semiconductor substrate 111 closed by bonding surface 112a of pedestal 112 for a reference pressure chamber 113. Pedestal 112 is a hexahedron made of heat-resisting glass and having rectangular cross sections.

A diaphragm 114 is formed in the portion of pressure detecting device 110 corresponding to reference pressure chamber 113 of semiconductor substrate 111. Not-shown strain gauges are formed on diaphragm 114 and a not-shown bridge circuit is formed by connecting the strain gauges in the form of a bridge. A not shown amplifier circuit connected to the bridge circuit is formed in semiconductor substrate 111.

A strain is caused in pressure detecting device 110 when a pressure is exerted to diaphragm 114 of semiconductor substrate 111. An electrical signal is outputted from the bridge circuit in the form of a voltage caused by the stress. The electrical signal is amplified by the not shown amplifier circuit and the amplified electrical signal is outputted from the amplifier circuit. Pressure detecting device 110 that has the structure as described above and works as described above is an absolute-pressure-type one that employs strain gauges. Alternatively, pressure detecting device 110 may be an electrostatic-capacitance-type one.

Housing base 120 is a resin molding material made of polyphenylene sulfide (hereinafter referred to as "PPS") and such a thermoplastic resin. Housing base 120 includes a housing recess 121 for housing pressure detecting device 110 therein. Housing base 120 includes also a space on the opening side of housing recess 121. The space on the opening side of housing recess 121 constitutes a part of the pressure detecting chamber described later. Alternatively, housing base 120 may be made of a heat-resisting thermoplastic resin other than PPS with no associated problem.

Pressure detecting device 110 is housed in housing recess 121 of housing base 120 in such a manner that pressure detecting device 110 is connected and fixed to housing recess 121 via a connecting material 129. In detail, pressure detecting device 110 is connected and fixed to housing base 120 with connecting material 129 interposed between the bottom surface 121a of housing recess 121 and the bottom surface 112b of pedestal 112, on which pressure detecting device 110 is mounted. Thus, pressure detecting device 110 is fixedly supported by housing base 120.

Connecting material 129 is a resin material made of a silicone resin adhesive and such a silicone resin. In detail, connecting material 129 is made of a silicone resin adhesive (X32-2170AB supplied from Shin-Etsu Chemical Co., Ltd.). Connecting material 129 exhibits a tensile elongation percentage of 400% or higher. Connecting material 129 is formed such that the thickness thereof (the distance between bottom surface 121*a* of housing recess 121 and bottom surface 112*b* of pedestal 112) is from 30 µm to 100 µm.

Referring now to FIG. 3B, protrusions 150 maybe formed on bottom surface 121*a* of housing recess 121 to adjust the thickness of connecting material 129 with no associated problem. Protrusions 150 are formed in such an arrangement that the tips of protrusions 150 are in contact with the four corners of bottom surface 112*b* of pedestal 112, to which pressure detecting device 110 is fixed. Alternatively, protrusions 150 may be shaped with respective protruding stripes. Protrusions 150 are from 30 µm to 100 µm in height corresponding to the thickness of connecting material 129. It is not always necessary for the tips of protrusions 150 to be in contact with bottom surface 112*b* of pedestal 112. In other words, connecting material 129 may be interposed between pedestal 112 and the tip's of protrusions 150. Connecting material 129 formed as described above facilitates absorbing the thermal stress so that the thermal stress may not be transmitted from housing base 120 to pressure detecting device 110 via connecting material 129 and effectively preventing thermal response delay from arising in pressure detecting apparatus 100.

Lead terminals 122 are integrated into housing base 120 by insertion molding such that lead terminals 122 are extending from the vicinity of the opening of housing recess 121 in the direction perpendicular to the central axis C. Lead terminals 122 are led outside housing base 120. Each lead terminal 122 is a plate formed by punching a base alloy of nickel (Ni) and iron (Fe). Each lead terminal 122 includes a land section 123 arranged around the opening of housing recess 121 and a lead section 124 extended from land section 123 to the outside of housing base 120. As shown in FIG. 1, eight lead sections 124 are exemplary disposed in pressure detecting apparatus 100.

Land section 123 on each lead terminal 122 is connected electrically, via bonding wires 125 made of aluminum (Al) or gold (Au), to the surface 111*a* of semiconductor substrate 111 connected and fixed to housing base 120. Lead section 124 of each lead terminal 122 is connected to an external wiring material (not shown) outside housing base 120. Although not illustrated, an internal circuit, connected to pressure detecting device 110 or land sections 123 of lead terminals 122 via bonding wires 125, may be disposed in housing base 120 with no problem. The internal circuit adjusts the electrical signals outputted from pressure detecting device 110 and outputs the adjusted signals outside pressure detecting apparatus 100.

In the space formed on the opening side of housing recess 121 in housing base 120, a protecting material 126 is formed in such a manner that protecting material 126 covers and seals the surface 111*a* of semiconductor substrate 111 together with bonding wires 125 and land sections 123 of lead terminals 122. Protecting material 126 is made of a gel resin. Protecting material 126 is disposed to protect pressure detecting device 110, bonding wires 125 and such constituent elements from contaminants and to transmit the pressure to be measured to pressure detecting device 110 without fail. It is preferable to dispose protecting material 126 also between the side face of housing recess 121 and the side face of pressure detecting device 110.

In the circumference portion of the opening side surface of housing base 120, an insert-fitting groove 127 is formed. Housing cover 130 is mounted on housing base 120 with an insert-fitting protrusion 137 protruding from housing cover 130 made to fit into insert-fitting groove 127. Housing cover 130 and housing base 120 are adhered and fixed to each other with a not shown adhesive filling insert-fitting groove 127. Pressure detecting device 110 housed in housing base 120 is sealed and fixed to pressure detecting apparatus 100 by housing cover 130.

Housing cover 130 is a resin molding made of PPS in the same manner as housing base 120. Housing cover 130 includes a flange section 131 and a cylindrical pressure transmitting section 132 standing vertically from the major surface 131*a* of flange section 131. Housing cover 130 has a cross-sectional structure shaped with a letter T. A pressure transmitting hole 133 is bored through pressure transmitting section 132 concentrically with the central axis C. When housing cover 130 is bonded and fixed to housing base 120, pressure transmitting hole 133 is connected to the space in housing base 120. Housing cover 130 may be made of any heat-resisting resin other than PPS with no associated problem. A pressure detecting chamber 128 is the space in housing base 120 sectioned by flange section 131 of housing cover 130.

The pressure of the air, for example, which is a measurement environment, is transmitted to pressure detecting chamber 128 through pressure transmitting hole 133 bored through pressure transmitting section 132 of housing cover 130. Diaphragm 114 is deformed by the difference between the air pressure transmitted to pressure detecting chamber 128 and the internal pressure of reference pressure chamber 113 in pressure detecting device 110. An electrical signal is outputted from pressure detecting device 110 based on the strain caused by the deformation of diaphragm 114. The electrical signal outputted from pressure detecting device 110 is outputted outside pressure detecting apparatus 100 via bonding wires 125, the internal circuit, and lead terminals 122. The pressure is measured by a not shown measuring apparatus disposed outside pressure detecting apparatus 100 based on the outputted electrical signal.

Pressure detecting device 110 and housing base 120 are connected and fixed to each other by connecting material 129 exhibiting a tensile elongation percentage of about 400% or higher. Therefore, pressure detecting apparatus 100 facilitates obtaining a structure that transmits hardly any thermal stress caused from housing base 120 to pressure detecting device 110, thereby effectively preventing thermal response delay from arising, and thus producing pressure measurement results with high reproducibility.

Pressure detecting apparatus 100 as described above is manufactured in the following way. Dies are formed to fit housing base 120 and housing cover 130. For forming housing base 120, lead terminals 122 are fixed at the respective positions in the die for exclusive use, and housing base 120 is formed by loading a resin such as PPS into the die, and by cooling to solidify the resin. Housing cover 130 is formed by loading a resin such as PPS into the die for exclusive use and by cooling to solidify the resin. When PPS is used as the resin for housing base 120 and housing cover 130, gases are liable to be caused in molding PPS and flashes are liable to be caused on the moldings. Therefore, if degassing is conducted and flashes are removed, housing base 120 and housing cover 130 will be manufactured very precisely.

After forming housing base 120 and housing cover 130, pressure detecting device 110 is connected and fixed to housing recess 121 of housing base 120 via connecting material 129, the internal circuit is mounted, and lead terminals 122 are connected to pressure detecting device 110 and to the internal circuit via bonding wires 125. The space on the opening side of housing recess 121 and the space between pressure detecting device 110 and housing recess 121 are covered with protecting material 126 made of a gel resin. And, housing cover 130 is mounted on and fixed to housing base 120. Thus, pressure detecting apparatus 100 is manufactured.

Pressure detecting apparatus 100, which connects and fixes pressure detecting device 110 to housing base 120 with connecting material 129 exhibiting a tensile elongation percentage of about 400% or higher, realizes a structure that transmits hardly any thermal stress caused from housing base 120 to pressure detecting device 110. The reasons for defining the tensile elongation percentage of connecting material 129 as described above will be explained below.

Figure 4:
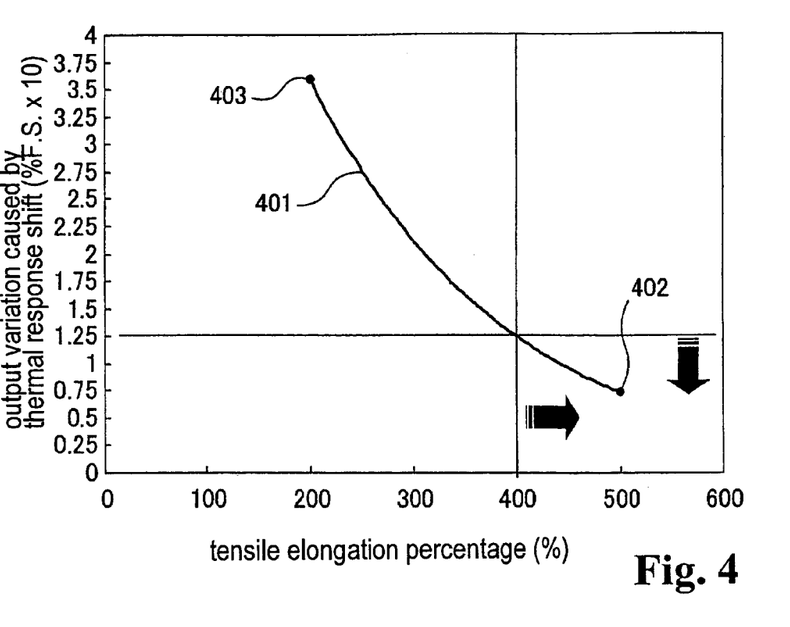
FIG. 4 shows a curve relating the output variation (%F.S.× 10) caused by the thermal response shift with the tensile elongation percentage (%) of the connecting material.

FIG. 4 shows a curve relating the output variation (%F.S.×10) caused by the thermal response shift with the tensile elongation percentage (%) of connecting material 129. The present inventors have conducted the following tests for defining the tensile elongation percentage of connecting material 129. A strength characteristics measuring apparatus (EZ Test supplied from Shimadzu Corp.) is used for measuring the tensile elongation percentage. Tensile elongation percentage measuring tests are conducted on a silicone resin adhesive (X32-2170AB supplied from Shin-EtsuChemical Co., Ltd.) (hereinafter referred to as a "sample 1") and a silicone resin adhesive (TSE322 supplied from GE Toshiba Silicones Co., Ltd.) for comparison (hereinafter referred to as a "sample 2").

The samples 1 and 2 are 8 mm in width, 1.5 mm in height (thickness) and 50 mm in length. The distance between the jigs for fixing the sample to the measuring apparatus is set at 10 mm. The tensile tests are conducted at the pulling rate of 60 mm/min. The output variation caused by the thermal response shift and described in FIG. 4 is the shift value of an output from the pressure detecting apparatus (detected output variation) caused when the pressure detecting apparatus, left in an environment of 130° C. for 1 hr, is returned to the room temperature environment (from 20° C. to 25° C.). The unit of the output variation caused by the thermal response shift is the percentage of an output voltage from pressure detecting apparatus 100 to the full scale (hereinafter referred to as the "F.S.") of the output. Since the output voltage values obtained are so small that the output voltage values are multiplied by 10 and the corrected output voltage values are expressed.

Since it is necessary for pressure detecting apparatus 100 and such on-vehicle equipment to be very precise, it is preferable for the output variation caused by the thermal response shift to be 0.125 (%F.S.) or less or 1.25 (%F.S.×10) or less in the 10 times expression. The tests are conducted based on the threshold for judging the output variations caused by the thermal response shift set at 1.25 (%F.S.×10). The elongation of connecting material 129 is the difference obtained by setting two gage marks (fixed points fixed by the fixing jigs), by measuring the distance L0 between the gage marks (the distance between the fixing jigs), by measuring the distance L1 between the gage marks after the tests, and by calculating L1−L0. The elongation percentage in % is calculated from the following formula (1).

$$100\times(L1-L0)/L0 \quad (1)$$

The tensile elongation percentage measuring tests conducted under the conditions as described above have revealed clear differences expressed by a correlation curve 401 shown in FIG. 4 that connects the measurement results on the samples 1 and 2. Correlation curve 401 represents the correlation between the output variations and the elongation percentage in the measurement results on the samples 1 and 2. Correlation curve 401 indicates that as the elongation percentage becomes larger, the output variation becomes smaller, resulting in an improved thermal response. The lower right end point 402 on correlation curve 401 represents the results on the sample 1 and the upper left endpoint 403 on correlation curve 401 represents the results on the sample 2.

In the sample 1, when the tensile elongation percentage is around 500%, the output variation caused by the thermal response shift is about 0.77 (%F.S.×10) as correlation curve 401 clearly indicates. In the sample 2, when the tensile elongation percentage is around 200%, the output variation caused by the thermal response shift is about 3.6 (%F.S.×10) as correlation curve 401 clearly indicates. For conducting the tests, the hardness (JIS A) is set at 20 for the sample 1 and at 17 for the sample 2. It has been clarified that if connecting material 129 is made of a material having a hardness of around 20, there will exist almost no correlation between the output variation caused by the thermal response shift and the hardness. Therefore, if connecting material 129 is made of a material having a hardness of around 20, the correlation between the elongation characteristics of connecting material 129 and the output variation caused by the thermal response shift will be large. In other words, if connecting material 129 is made of a material having a hardness of around 20, there will be almost no correlation between the elongation percentage and the hardness.

Therefore, if the elongation percentage of connecting material 129 is set to be in the range indicated by the black arrows in FIG. 4 (the range, in which the output variation is 1.25 (%F.S.×10) or smaller and the elongation percentage is about 400% or higher), connecting material 129 will absorb the stress exerted from housing base 120 to pressure detecting device 110 by the excellent elongation characteristics thereof and pressure detecting apparatus 100 will be provided with excellent thermal response.

As described above in connection with the embodiments of the invention, connecting material 129 exhibiting excellent elongation characteristics absorbs the stress exerted from housing base 120 so that the stress may not be transmitted to pressure detecting device 110. Therefore, pressure detecting apparatus 100 exhibits very precise initial detection performances and guarantees very reliable pressure detection performances.

Although the materials and the shapes of housing base 120 and housing cover 130 and the structures of the constituent elements in pressure detecting apparatus 100 have been described numerically, the descriptions are exemplary and changes and modifications are obvious to those skilled in the art without departing from the true spirit of the invention.

As described above, since pressure detecting device 110 and housing base 120 are connected and fixed to each other with connecting material 129 exhibiting an elongation percentage of about 400% or higher, pressure detecting apparatus 100 according to the invention facilitates absorbing the exerted stress based on the excellent elongation characteristics thereof and exhibits excellent thermal response. Pressure detecting apparatus 100 that exhibits excellent thermal response facilitates realizing a structure immune to the temperature change caused in the measurement environment and obtaining measurement results with very high reproducibility.

As described above, the pressure detecting apparatus according to the invention is employable for various kinds of use, in which pressure detection or pressure measurement is conducted.

The disclosure of Japanese Patent Application No. 2005-130533 filed on Apr. 27, 2005, is incorporated herein.

What is claimed is:

1. A pressure detecting apparatus comprising:
   a pressure detector for converting a strain induced by a stress exerted thereto to an electrical signal, and for outputting the electrical signal;
   a base comprising a housing for accommodating the pressure detector therein; and
   a connector, interposed between the pressure detector and the housing, for connecting the pressure detector and the housing, said connector having a tensile elongation percentage of 400% or higher.

2. The pressure detecting apparatus according to claim 1, wherein the pressure detector comprises a semiconductor.

3. The pressure detecting apparatus according to claim 1, wherein the base comprises a resin molding.

4. The pressure detecting apparatus according to claim 1, wherein the connector comprises a silicone resin adhesive.

5. The pressure detecting apparatus according to claim 1, wherein the connector is provided such that a distance between a bonding plane of the pressure detector and a bonding plane of the housing is from 30μm to 100μm.

6. The pressure detecting apparatus according to claim 1, wherein said pressure detector comprises a pedestal, a semiconductor substrate disposed on the pedestal, and a diaphragm attached to the semiconductor substrate, said connector being arranged between bottoms of the pedestal and housing of the base.

7. The pressure detecting apparatus according to claim 6, wherein said base further includes a plurality of protrusions projecting upwardly from the bottom of the housing to receive the pedestal thereon.

8. The pressure detecting apparatus according to claim 7, further comprising a protecting material for covering on and around the pressure detector.

* * * * *

UNITED STATES PATENT AND TRADEMARK OFFICE
CERTIFICATE OF CORRECTION

PATENT NO.         : 7,234,358 B2
APPLICATION NO.    : 11/354959
DATED              : June 26, 2007
INVENTOR(S)        : Kazunori Saito et al.

It is certified that error appears in the above-identified patent and that said Letters Patent is hereby corrected as shown below:

Please change column 5, line 23, "the tip's" to -- the tips--, and column 7, line 28, "Shin-EtsuChemical" to --Shin-Etsu Chemical--.

Signed and Sealed this

Twentieth Day of November, 2007

JON W. DUDAS
*Director of the United States Patent and Trademark Office*